(12) United States Patent
Baska et al.

(10) Patent No.: US 11,076,493 B2
(45) Date of Patent: Jul. 27, 2021

(54) IMPLEMENTING HIGH-SPEED SIGNALING VIA DEDICATED PRINTED CIRCUIT-BOARD MEDIA

(71) Applicant: International Business Machines Corporation, Armonk, NY (US)

(72) Inventors: Douglas A. Baska, Pine Island, MN (US); Daniel M. Dreps, Georgetown, TX (US); Rohan U. Mandrekar, Austin, TX (US); Roger D. Weekly, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 389 days.

(21) Appl. No.: 16/038,417

(22) Filed: Jul. 18, 2018

(65) Prior Publication Data

US 2018/0352662 A1 Dec. 6, 2018

Related U.S. Application Data

(60) Continuation of application No. 14/089,084, filed on Nov. 25, 2013, now Pat. No. 10,034,393, which is a
(Continued)

(51) Int. Cl.
*H05K 3/46* (2006.01)
*H05K 1/02* (2006.01)
(Continued)

(52) U.S. Cl.
CPC ......... *H05K 3/4623* (2013.01); *H05K 1/0216* (2013.01); *H05K 1/141* (2013.01);
(Continued)

(58) Field of Classification Search
CPC .... H05K 3/4623; H05K 3/368; H05K 1/0216; H05K 1/141
See application file for complete search history.

(56) References Cited

U.S. PATENT DOCUMENTS 4,730,232 A 3/1988 Lindberg
5,764,071 A 6/1998 Chan et al.
(Continued)

FOREIGN PATENT DOCUMENTS

GB 2459752 11/2009

OTHER PUBLICATIONS

"U.S. Appl. No. 12/895,251", filed Jan. 31, 2013, 16 pages.
(Continued)

*Primary Examiner* — Livius R. Cazan
(74) *Attorney, Agent, or Firm* — Richard B. Thomas

(57) ABSTRACT

Some embodiments of the inventive subject matter are directed to forming, on a first circuit board, first pins that connect to first leads of a first electronic component; forming, on the first circuit board, second pins that connect to second leads of a second electronic component; affixing the first circuit board to a second circuit board having a first layer with first wires; and forming second wires on a second layer of the second circuit board, wherein said forming the second wires creates an electrical connection on the second circuit board between a portion of the first pins and a portion of the second pins. In some embodiments, the second circuit board is smaller than the first circuit board, and the second layer of the second circuit board is, in length, approximately equivalent to a distance between the first electronic component and the second electronic component.

10 Claims, 10 Drawing Sheets

Related U.S. Application Data division of application No. 12/895,251, filed on Sep. 30, 2010, now Pat. No. 8,619,432.

(51) Int. Cl.
  *H05K 1/14* (2006.01)
  *H05K 3/36* (2006.01)

(52) U.S. Cl.
  CPC ... *H05K 3/368* (2013.01); *H05K 2201/10189* (2013.01); *Y10T 29/49126* (2015.01); *Y10T 29/49162* (2015.01); *Y10T 29/53004* (2015.01)

(56) References Cited

U.S. PATENT DOCUMENTS

| | | | |
|---|---|---|---|
| 5,788,513 | A | 8/1998 | Kajiwara |
| 5,805,865 | A | 9/1998 | Mimura et al. |
| 5,929,646 | A | 7/1999 | Patel et al. |
| 6,410,983 | B1 | 6/2002 | Moriizumi et al. |
| 6,459,039 | B1 | 10/2002 | Bezama et al. |
| 6,661,088 | B1 | 12/2003 | Yoda et al. |
| 6,945,791 | B2 | 9/2005 | Budell et al. |
| 7,014,472 | B2 | 3/2006 | Fjelstad et al. |
| 7,176,131 | B2 | 2/2007 | Meyer-Berg et al. |
| 7,394,665 | B2 | 7/2008 | Hamasaki et al. |
| 7,405,364 | B2 | 7/2008 | Nair et al. |
| 7,436,057 | B2 | 10/2008 | Long et al. |
| 7,543,373 | B2 | 6/2009 | Mcallister et al. |
| 7,613,368 | B2 | 11/2009 | Hougham et al. |
| 8,619,432 | B2 | 12/2013 | Baska et al. |
| 10,034,393 | B2 | 7/2018 | Baska et al. |
| 2009/0178273 | A1 | 7/2009 | Lauffer |
| 2012/0081873 | A1 | 4/2012 | Baska et al. |
| 2014/0075749 | A1 | 3/2014 | Baska et al. |

OTHER PUBLICATIONS

"U.S. Appl. No. 14/089,084 Ex Parte Quayle Action", filed Sep. 22, 2017, 5 pages.

"U.S. Appl. No. 14/089,084 Office Action", dated Mar. 9, 2017, 10 pages.

Asselta, et al., "Board-To-Board Connector Assembly", IBM, Feb. 1, 1990, 2 pages.

Hughes, et al., "BladeCenter Midplane and Media Interface Card", IBM Journal of Research and Development; vol. 49, Issue: 6, Nov. 2005, 823-836.

Oh, et al., "Cancelation of a Crosstalk Induced Noise in a DDR Memory Interface", 2008 International SoC Design Conference, 2008, 2 pages.

IMPLEMENTING HIGH-SPEED SIGNALING VIA DEDICATED PRINTED CIRCUIT-BOARD MEDIA

RELATED APPLICATIONS

This application is a Continuation of and claims the priority benefit of U.S. application Ser. No. 14/089,084 filed Nov. 25, 2013 which is a divisional of, and claims the priority benefit of, U.S. application Ser. No. 12/895,251 filed Sep. 30, 2010. The Ser. Nos. 12/895,251 and 14/089,084 Application is incorporated herein by reference.

BACKGROUND

Embodiments of the inventive subject matter generally relate to the field of high-speed signaling and circuit boards, and, more particularly, to high-speed signaling via multiple circuit boards.

Printed circuit boards (PCBs) include electronic components (e.g., processor chips, memory modules, etc.) with multiple input and output leads. The multiple leads needs to be connected to other electronic components, such as other processor chips, via wiring, or conductive wires, that are formed onto the PCB. Some PCBs, or portions of PCBs, may have a dense amount of wires connecting a dense amount of leads for multiple electronic components. For example, some PCBs include multiple processors that connect to each other. Each of the processors needs to communicate with each other, usually at very high speeds. However, because the PCB includes multiple processors, the placement of the processors, and their spatial configurations on the PCB, create challenges in connecting the wires for the processors together on the PCB. One such challenge is that the spatial configuration of the wires becomes very crowded when many electronic components need to be connected. The crowded wires produce background noise or cross-talk that interferes with each other's signals. Another challenge is that because of the limited space for the wires, the wires need to be very small. The small size of the wires results in signal attenuation quickly over only a short distance.

Some PCB designers have developed specific configurations for wires on a PCB. Some conventional configurations can, at best, provide high-speed, single-ended signaling at only very short distances (2-3 inches). When the wires increase in length beyond the short distances cross-talk and signal attenuation significantly interfere with signals on the wires. Thus, as designers place more electronic components on a PCB that need to communicate with each other, PCB designers are faced with increasingly significant challenges for connecting the electronic components over longer distances.

SUMMARY

Some embodiments include a method directed to forming a first plurality of pins on a first circuit board, where the first plurality of pins are configured to connect to a first plurality of leads of a first electronic component. The method can further be directed to forming a second plurality of pins on the first circuit board. The second plurality of pins are configured to connect to a second plurality of leads of a second electronic component. The method can further be directed to affixing the first circuit board to a second circuit board. The first circuit board includes a first layer configured with first wires. The second circuit board includes a second layer configured for forming circuitry. The second circuit board is smaller in size than the first circuit board. For example, the second layer of the second circuit board is limited in length to approximately a distance between the first electronic component and the second electronic component. The method can further be directed to forming second wires on the second layer of the second circuit board. The forming of the second wires creates an electrical connection on the second circuit board between a portion of the first plurality of pins and a portion of the second plurality of pins.

Some embodiments include a method directed to: forming a first circuit board that includes an electronic component, said electronic component including a plurality of leads, and said first circuit board including first wires that connect to a first portion of the plurality of leads; affixing a second circuit board to the first circuit board, said second circuit board including second wires, said second circuit board being smaller in size than the first circuit board; and forming a plurality of electrical connectors that extend through a thickness of the first circuit board, wherein the plurality of electrical connectors connect a second portion of the plurality of leads to the second wires, wherein the first circuit board includes an additional electronic component, wherein the second circuit board is limited in size to approximately a distance between the electronic component and the additional electronic component, wherein the distance between the electronic component and the additional electronic component is between approximately 5 inches to approximately 30 inches, and wherein the second wires include a spatial configuration on the second circuit board that has a signal-to-cross talk ratio of greater than 17 decibels for signal communications at greater than or equal to approximately 5 Gigabits per second for single ended signaling.

Some embodiments include a computer program product for connecting electronic circuitry, the computer program product comprising a computer readable storage medium having computer readable program code embodied therewith, the computer readable program code comprising computer readable program code configured to: affix a first circuit board to a second circuit board, wherein the first circuit board includes a first electronic component and a second electronic component, wherein the first circuit board includes a plurality of pins associated with a plurality of leads for the first electronic component, wherein the first circuit board includes a first layer on which first wires are formed, wherein said first wires connect to a first portion of the plurality of pins, wherein the second circuit board includes a second layer on which second wires are formed, and wherein the second circuit board is limited in size to approximately a distance between the first electronic component and the second electronic component; and form a plurality of electrical connectors that extend through a thickness of the first circuit board and connect a second portion of the plurality of pins to the second wires on the second layer, wherein the second circuit board is smaller than the first circuit board.

BRIEF DESCRIPTION OF THE DRAWINGS

The present embodiments may be better understood, and numerous objects, features, and advantages made apparent to those skilled in the art by referencing the accompanying drawings.

DESCRIPTION OF EMBODIMENT(S)

The description that follows includes exemplary systems, methods, techniques, instruction sequences, and computer program products that embody techniques of the present inventive subject matter. However, it is understood that the described embodiments may be practiced without these specific details. For instance, although examples refer to printed circuit boards, other instances may include printed wiring boards, etched wiring board, some combinations therefore, or other forms of media for connecting electronic components together, etc. In another instance, although some examples refer to single-ended type signaling, other instances may include differential type signaling. In other instances, well-known instruction instances, protocols, structures, and techniques have not been shown in detail in order not to obfuscate the description.

Figure 1A:
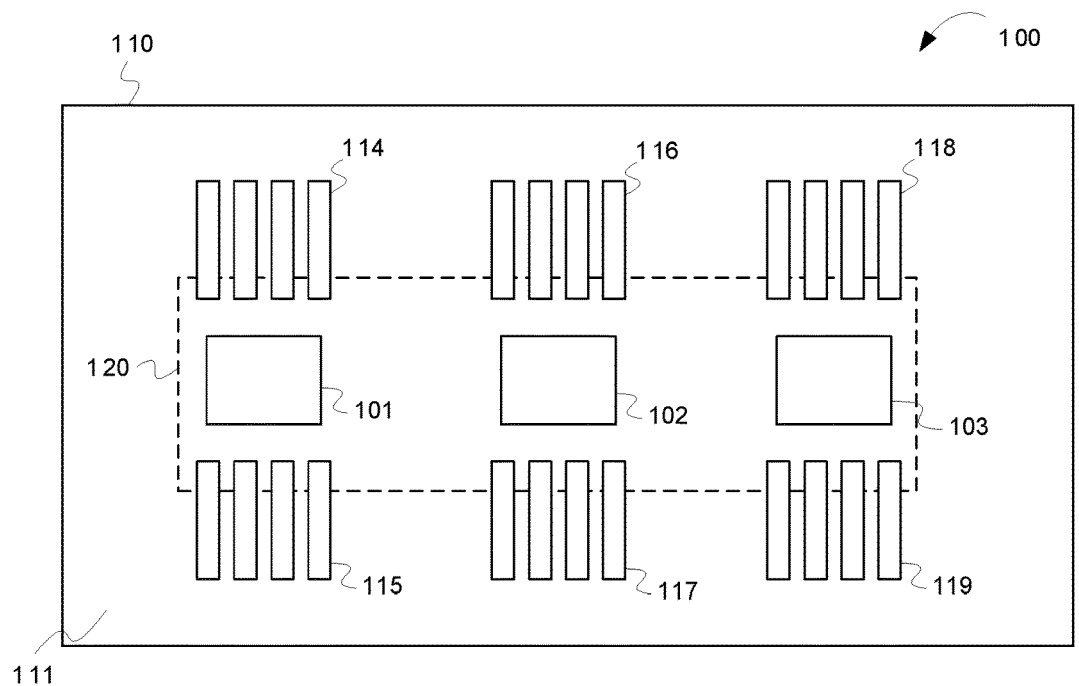
FIGS. 1A-1C are example conceptual diagrams of a printed circuit board assembly using a dedicated printed circuit board media for high-speed signaling, according to some embodiments.
Figure 1B:
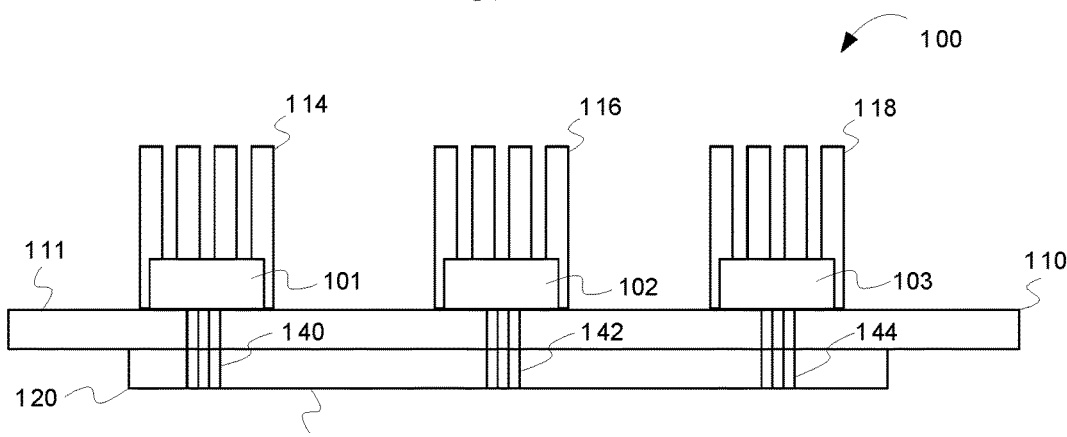
Figure 1C:
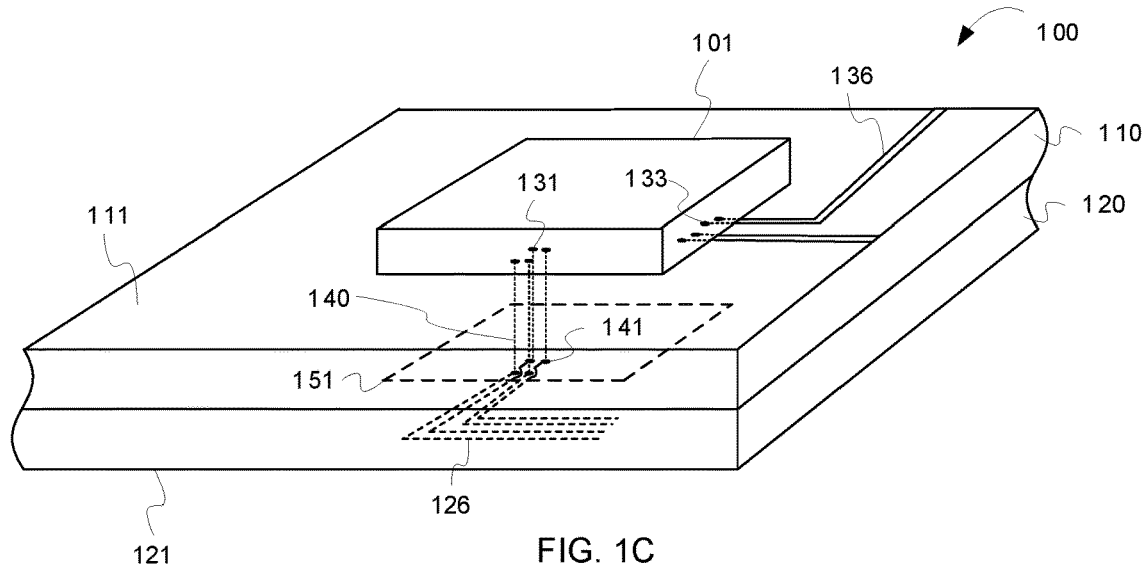

Some embodiments of the inventive subject matter include configurations of wires on a PCB over longer distances (e.g., up to approximately 30 inches or more, ranging between approximately 5 to 30 inches or more, etc.), that transmit signals at high frequencies and high speeds, with limited cross-talk and limited attenuation of the signals over the wires. FIGS. 1A-1C illustrate one example according to some embodiments.

FIGS. 1A-1C are example conceptual diagrams of a printed circuit board assembly using a dedicated printed circuit board media for high-speed signaling, according to some embodiments. FIG. 1A is a top view of a printed circuit board assembly (PCBA) 100. FIG. 1B is a side, cut-away view of the PCBA 100. FIG. 1C is a three-dimensional perspective top view of the PCBA 100. The PCBA 100 includes a first circuit board ("first PCB") 110 affixed to a second circuit board 120. Electronic components are attached to the first PCB 110. The electronic components communicate signals with each other at high speeds (e.g., at approximately 5 Gigabits per second (Gbps) for single-ended signaling or higher for differential signaling). The electronic components may include, for example, single chip modules (SCM) 101, 102, and 103, such as processor units. The SCMs 101, 102 and 103 may include integrated circuits. The electronic components may also include memory units that communicate directly with the SCMs 101, 102, and 103, such as dual inline memory modules (DIMMs) 114, 115, 116, 117, 118 and 119 ("DIMMs 114-119"). High speed connections can also be used for optics, or other electronic components that need to communicate with each other at high speeds. The PCBA 100 also includes a second printed circuit board (second PCB) 120 affixed to the first PCB 110. The first PCB 110 may be referred to as a primary PCB. The second PCB 120 may also be referred to as a secondary PCB, a printed circuit board media, or a media board.

The PCBA 100 includes vias 140, 142, and 144 that run vertically through the first PCB 110 and through the second PCB 120. The vias 140, 142, and 144 make electrical connection to some leads, but not all leads of the SCMs 101, 102, or 103 mounted on the surface 111 of the first PCB 110. For instance, in FIG. 1C, the vias 140 connect to leads 131 but not leads 133 of the SCM 101. The vias 140 run perpendicular to the surface 111 of the first PCB 110 through the height, or thickness of the first PCB 110 into the material of the second PCB 120. The vias 140 can also run through at least some portion of the material of the second PCB 120 perpendicular to the surface 121 of the second PCB 120. The surface 121 is oriented in an opposite direction to the surface 111. As illustrated in FIG. 1C, the vias 140 attached to the SCM 101 at leads 131 terminate at connector pins 141, such as on the surface 121 of the second PCB 120. In some embodiments, the first PCB 110 and/or the second PCB 120 may be a multi-layered PCBs, where wiring can be formed on one or more of the layers of the first PCB and/or the second PCB 120. However, for sake of brevity, to simplify the description, FIG. 1, and other figures describes below, will appear to illustrate wiring on only one layer of the PCB 110 and the PCB 120. The connector pins 141 are part of a pin field 151, or grouping of conductive (e.g., metal) pins or pads to which wires 126 are connected.

The wires 126 (also referred to as traces, or tracks), run along the surface 121 of the second PCB 120 until connecting with additional pins (e.g., pins associated with SCMs 102 or 103) on the surface 121 of the second PCB 120. The additional pins are connected to the vias 142 and/or 144 for the SCMs 102 and/or 103.

The second PCB 120 is dedicated only to the connections between the high-speed components, such as the connections made by the wires 126. The second PCB 120 has a configuration that is smaller than the first PCB 110 and is large enough to place and route the wires 126 required to connect the pins 141 to the additional pins associated with the SCMs 102 and 103. The size of the second PCB 120 can be reduced to the size of the pin fields for the SCMs 101, 102, and 103, on the surface 121, plus the size of the wires 126 as long as the wires 126 have enough space to transmit signals over long distances (e.g., up to approximately 30 inches or more, between approximately 5-30 inches or more, etc.) at high speeds (e.g., at approximately 5 Gbps or more for single ended signaling) with minimal cross-talk and signal loss. However, because the size of the second PCB 120 is much smaller than the first PCB 110 and is only dedicated to connections made between high-speed electronic components (e.g., via the wires 126), the second PCB 120 does not require a substantial amount of board material. Thus, the board material can utilize exotic dielectric materials with a low dielectric constant and a low dielectric dissipation factor configured for high-frequency communications, such as Megtron6™, Nelco®, or Teflon®, for the second PCB 120. Further, because the second PCB 120 is dedicated only to connection between high-speed electronic components, the second PCB 120 can be tuned for wire widths and spacing that achieve a tolerable signal loss and favorable signal-to-crosstalk (S/Xt) value without affecting the configurations (e.g., placement, line spacing, widths, routing, etc.) of other line connectors for other electronic components on the first PCB 110.

Figure 2:
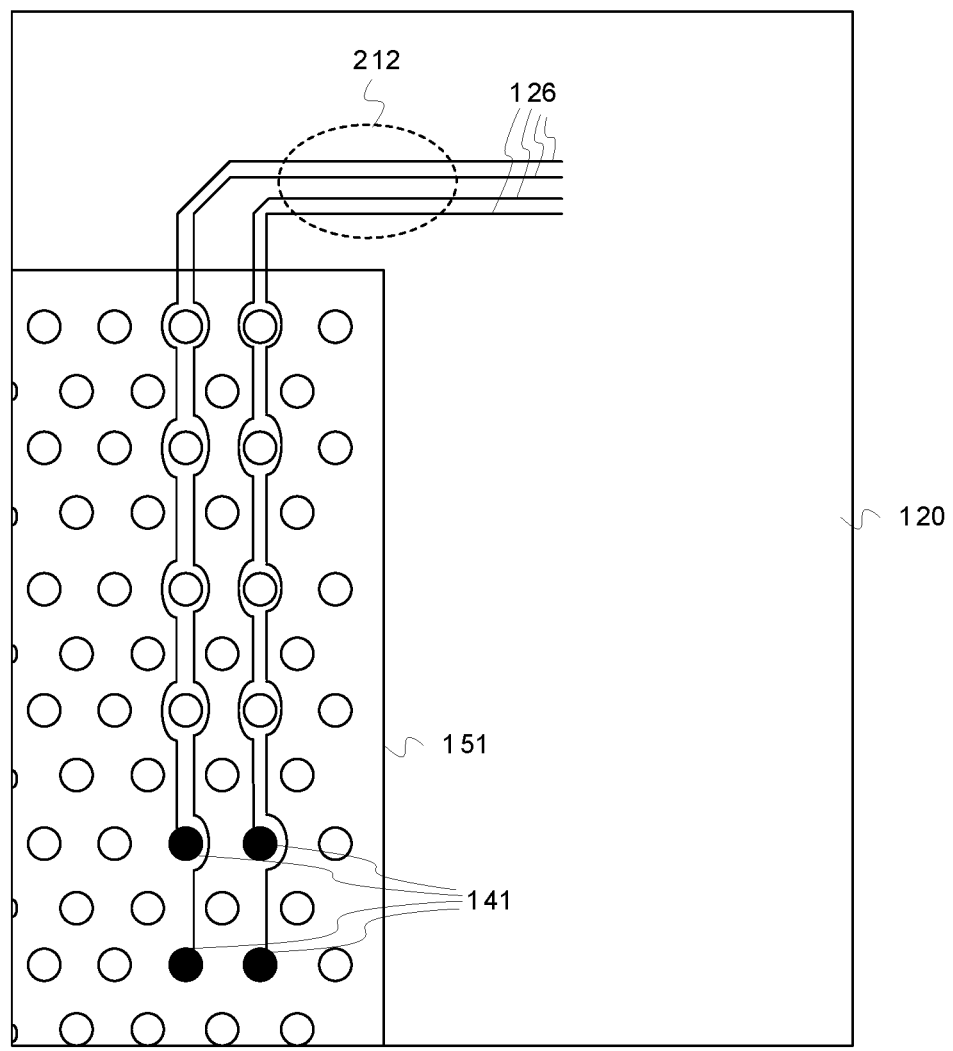
FIG. 2 is an example conceptual diagram of a wiring configuration according to some embodiments.

FIG. 2 is an example conceptual diagram of a wiring configuration according to some embodiments. FIG. 2 illustrates a bottom view of the portion of the PCBA 100 shown in FIG. 1C. In FIG. 2, as stated above, some of the leads or pins associated with the SCM 101 make electrical connection through vias 140 at the surface 121 of the second PCB 120. As stated previously, for sake of simplicity vias 140 are shown to extend through the second PCB 120 to the surface 121, however, in other embodiments, the depth of vias may extend to a further or lesser extent into the second PCB 120 depending on the number of layers of the second PCB 120. The vias 140 connect to one or more of the pins 141 on the pin field 151. The pin field 151 has two types of pins, signal pins and reference pins (e.g., a power or ground). The pins can be configured to have a one-to-one ratio of signal pins to reference pins. The pins 141, thus, can have a one to one (1:1) signal-to-reference (S/R) configuration. The 1:1 S/R pin configuration may also be referred to more succinctly as a one-to-one configuration. The pins 141, for example, are connected via any one of the vias 140 to a signal bus for the SCM 101.

As described previously, vias 140 only connect to some of the leads 131 of the SCM 101 (i.e., the leads 133 that do not connect to the vias 140 are instead routed onto the surface 111 of the first PCB 110 via wires 136 or to one or more other layers of the first PCB 110). Thus the pin field 151 is sparse and results in an enhanced escape and routing density. The escape and routing density is how easily the wires 126 can escape from the pin field 151. Because the pin field 151 is less dense than it would be if all of the wires were on the first PCB 110, then the escape and routing density improves by splitting up the amount of wires between electronic components into two boards, the first PCB 110 and the second PCB 120. Consequently, the configuration of the wires 126 on the second PCB 120 can collapse more quickly (see the area 212 which shows a immediate collapsing of wires 126 into a length-wise configuration on the second PCB 120 which is made possible because the pin field 151 is sparse and because routing on the media is dedicated solely to connections between high-speed electronic components such as via wires 126 on the second PCB 120).

Further, the second PCB 120 is dedicated only to connections between high-speed components, such as the SCMs 101, 102, an 103. As a result, the second PCB 120 has extra space that can be used for routing of the wires 126. Thus, the widths of the wires 126 can be wider than conventional wire widths because of the extra space on the second PCB 120. The wires 126, therefore, experience much less signal loss. The wires 126 can also be spaced out more than conventional spacing, also because of the extra space on the second PCB 120. The wires 126, therefore experience much less cross-talk and, therefore, greater signal-to-crosstalk ratios (S/Xt) than conventional configurations. For example, the configuration shown in FIG. 2 can produce an S/Xt of approximately 18.2 dB for single ended signaling at approximately 5 Gbps at 2.5 GHz. A conventional single-ended signaling type configuration at approximately 5 Gpbs at 2.5 GHz results in an S/Xt of approximately 11.7 dB. The configuration of FIG. 2, thus, represents over a 50% improvement to the conventional configuration. For single ended signaling, to achieve a 5 Gbps signal speed, over a distance of approximately 30 inches, the signal loss through the wires 126 ("thru loss") should be in the range of −10 dB to −12 db. However, conventional configurations are beyond the range −10 dB to −12 dB range at 5 Gbps at 2.5 GHz.

Figure 10A:
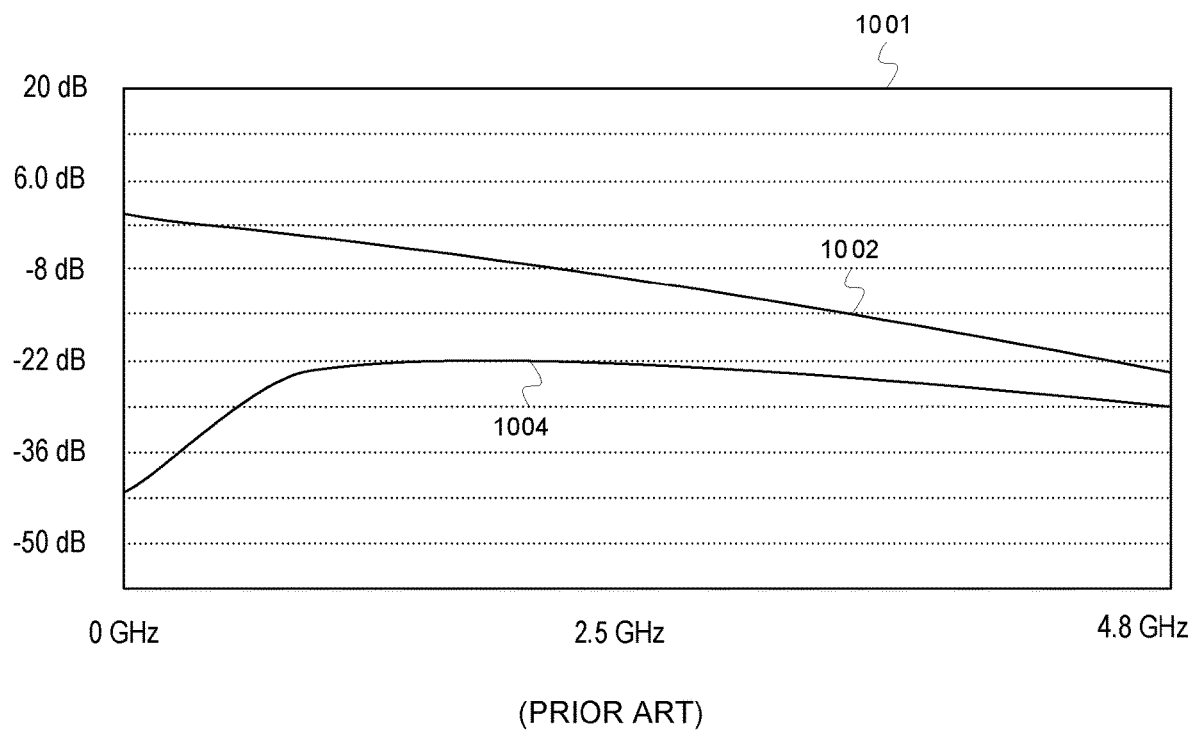
FIGS. 10A and 10B illustrate graphs showing comparison results between a conventional circuit board configuration (FIG. 10A) and a circuit board configuration according to some embodiments (FIG. 10B).
Figure 10B:
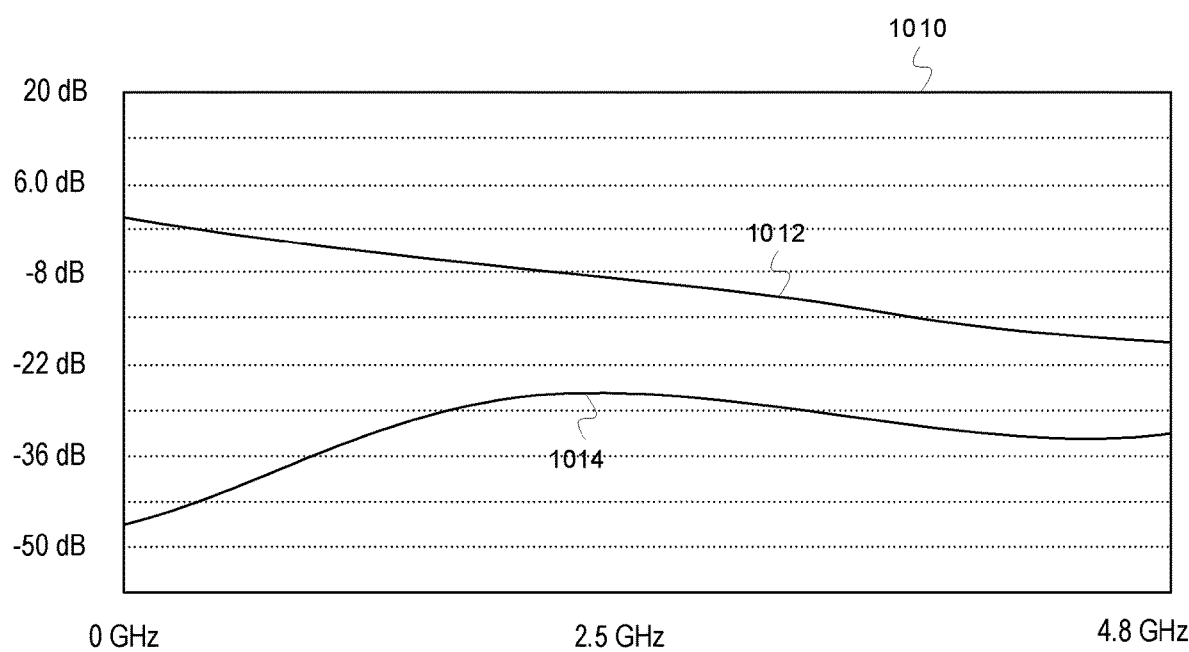

Further, because some embodiments of the invention can provide a high S/Xt of approximately 18.2 dB (e.g., at 5 Gbps for single ended signaling), embodiments provide a sufficiently high S/Xt for cyclic redundancy check (CRC) applications and single error connection double error detection (SECDED), which respectively require an S/Xt of approximately 17 dB. FIGS. 10A and 10B are illustrations of graphs showing experimental results. FIG. 10A illustrates an example graph 1001 that shows results from a conventional wiring configuration. The line 1002 represents a degree of thru loss. The line 1004 represents a degree of cross talk. According to the results in FIG. 10A, S/Xt is limited to approximately 11.7 dB at 2.5 GH, which is insufficient to run single ended signaling at 5 Gbps. FIG. 10B, on the other hand, illustrates an example graph 1010 that shows results from an embodiment of the invention configured for single-ended signaling. In FIG. 10B, the line 1012 represents a degree of thru loss and the line 1014 represents a degree of cross talk. According to the results in FIG. 10B, a single-ended channel, according to some embodiments, results in an S/Xt of 18 dB.

Figure 3:
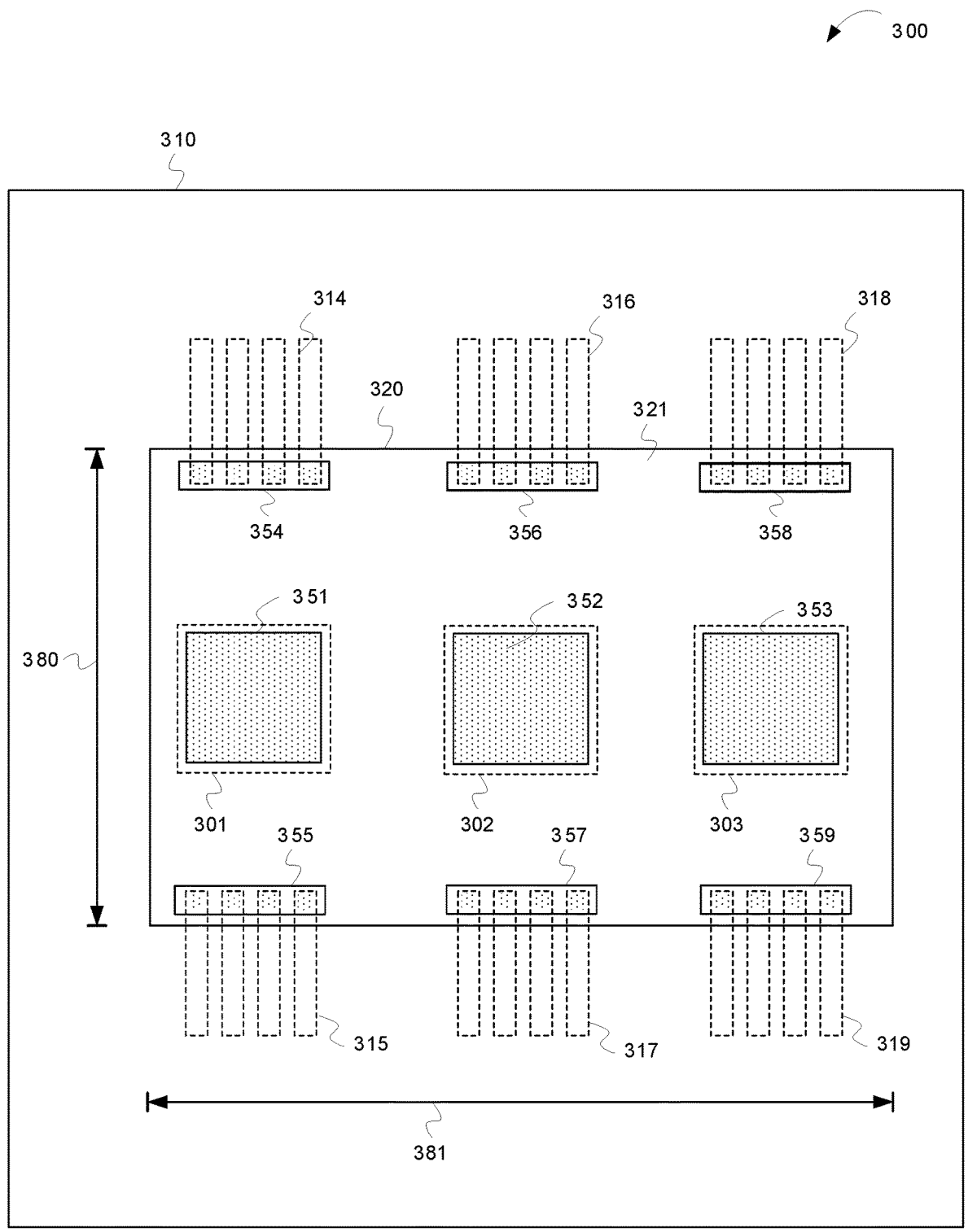
FIG. 3 is an example conceptual diagram of a printed circuit board assembly (PCBA) 300 according to some embodiments.

FIG. 3 is an example conceptual diagram of a PCBA 300 according to some embodiments. In FIG. 3, the PCBA 300 includes a first PCB 310 affixed to a second PCB 320. The second PCB 320 is smaller than the first PCB 310 as similarly described above. Electronic components (e.g., SCMs 301, 302 and 303, and memory modules 314, 315, 316, 317, and 318) are attached to the first PCB 310 (shown as dashed lines to represent that the electronic components are on a surface of the PCBA 300 opposite to a surface 321 on the second PCB 320). The second PCB 320 includes pin fields 351, 352, and 353, which include pins that connect, via a thickness of the first PCB 310, to some leads from the SCMs 301, 302, and 303. The pin fields 351, 352, and 353 are approximately equivalent in surface area size to the sizes of surface areas for the SCMs 301, 302 and 301. The second PCB 320 also includes pin fields 354, 355, 356, 357, 358 and 359 that connect, through the thickness of the first PCB 310, to leads for the memory modules 314, 315, 316, 317, 318 and 319. The size of the second PCB 320 (e.g., a surface area comprising a length 381 multiplied by and a width 380) is large enough to connect the pin fields 351, 352, 353, 354, 355, 356, 357, 358 and 359 via wires formed (e.g., etched) onto the surface 321 of the second PCB 320.

Figure 4:
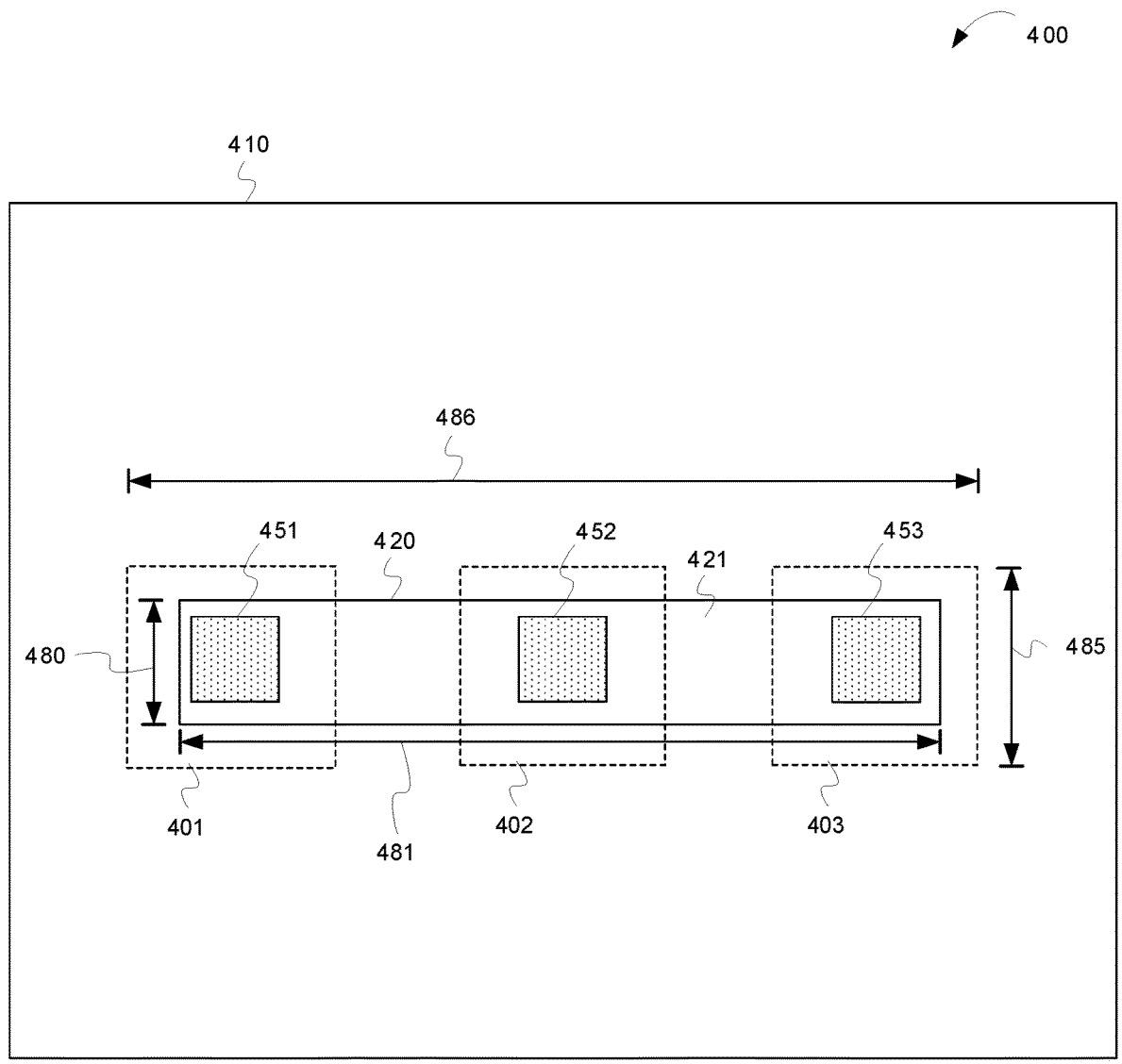
FIG. 4 is an example conceptual diagram of a PCBA 400 according to some embodiments.

FIG. 4 is an example conceptual diagram of a PCBA 400 according to some embodiments. In FIG. 4, the PCBA 400 includes a first PCB 410 affixed to a second PCB 420. The second PCB 420 is smaller than the first PCB 410 as similarly described above. Electronic components (e.g., SCMs 401, 402 and 403, and memory modules 414, 415, 416, 417, and 418) are attached to the first PCB 410 (shown as dashed lines to represent that the electronic components are on surface of the PCBA 400 opposite to a surface 421 of the second PCB 420). The second PCB 420 includes pin fields 451, 452, and 453, which include pins that connect, via a thickness of the first PCB 410, to some leads from the SCMs 401, 402, and 403. A size (e.g., a surface area comprising a length 481 multiplied by a width 480) of the second PCB 420 is large enough to connect the pin fields 451, 452, 453, via wires formed (e.g., etched) onto the surface 421 of the second PCB 420. However, the size of the second PCB 420 is actually smaller than a surface area that comprises the three SCMs 401, 402, and 403 (e.g., a length 486 multiplied by a width 486). The size of the second PCB 420 can be very small because the pin fields 451, 452, and 453, are much smaller in surface area size than the sizes of surface areas for the SCMs 401, 402 and 403. Only leads near the center of the SCMs 401, 402, and 403 extend (e.g., through vias) from the first PCB 410 through to the second PCB 420.

Figure 5:
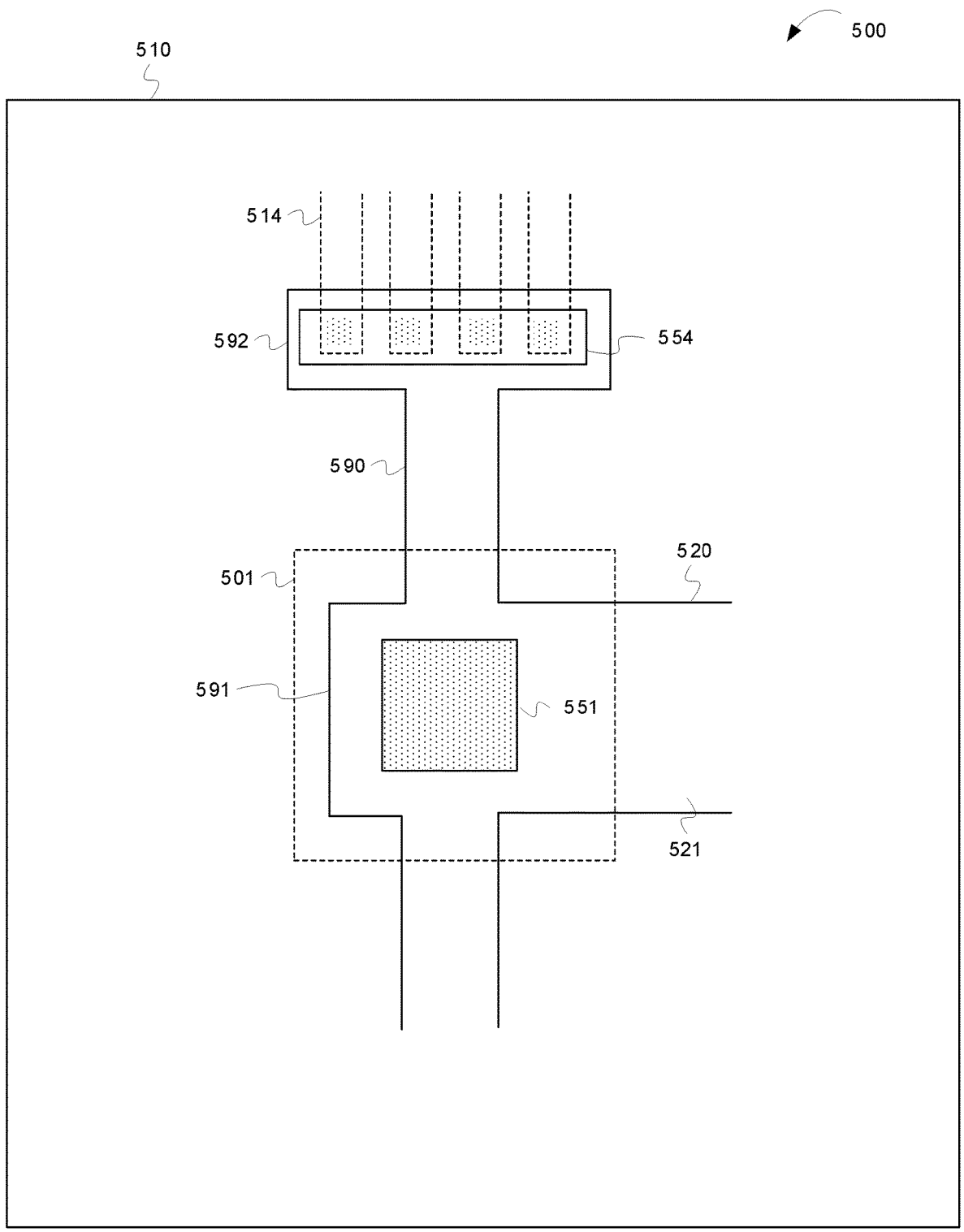
FIG. 5 is an example conceptual diagram of a PCBA 500 according to some embodiments.

FIG. 5 is an example conceptual diagram of a PCBA 500 according to some embodiments. In FIG. 5, the PCBA 500 includes a first PCB 510 affixed to a second PCB 520. The second PCB 520 is smaller than the first PCB 510 as similarly described above. Example electronic components (e.g., an SCM 501 and a memory module 514) are attached to the first PCB 510 (shown as dashed lines to represent that the electronic components are on surface of the PCBA 500 opposite to a surface 521 of the second PCB 520). The second PCB 520 includes a pin field 551 which includes pins that connect, via a thickness of the first PCB 510, to some leads from the SCMs 501. A second pin field 554 includes pins that connect, via the thickness of the first PCB 510, to some leads from the memory module 514. The second PCB 520 is an irregular shape having a bridge 590 that connects a first portion 591 of the second PCB 520 to a second portion 592 of the second PCB 520. The portion 591 and 592 include the pin fields 551 and 554. The portions 590 and 591 include wires that connect the pin fields 551 and 554 via the bridge 590. The bridge 590 is smaller than the first portion 591 and utilizes a small enough amount of board material to include only the wires needed to connect the pin field 554 to the pin field 551, but still permits the wires to have enough space and wire width as similarly described above.

Figure 6:
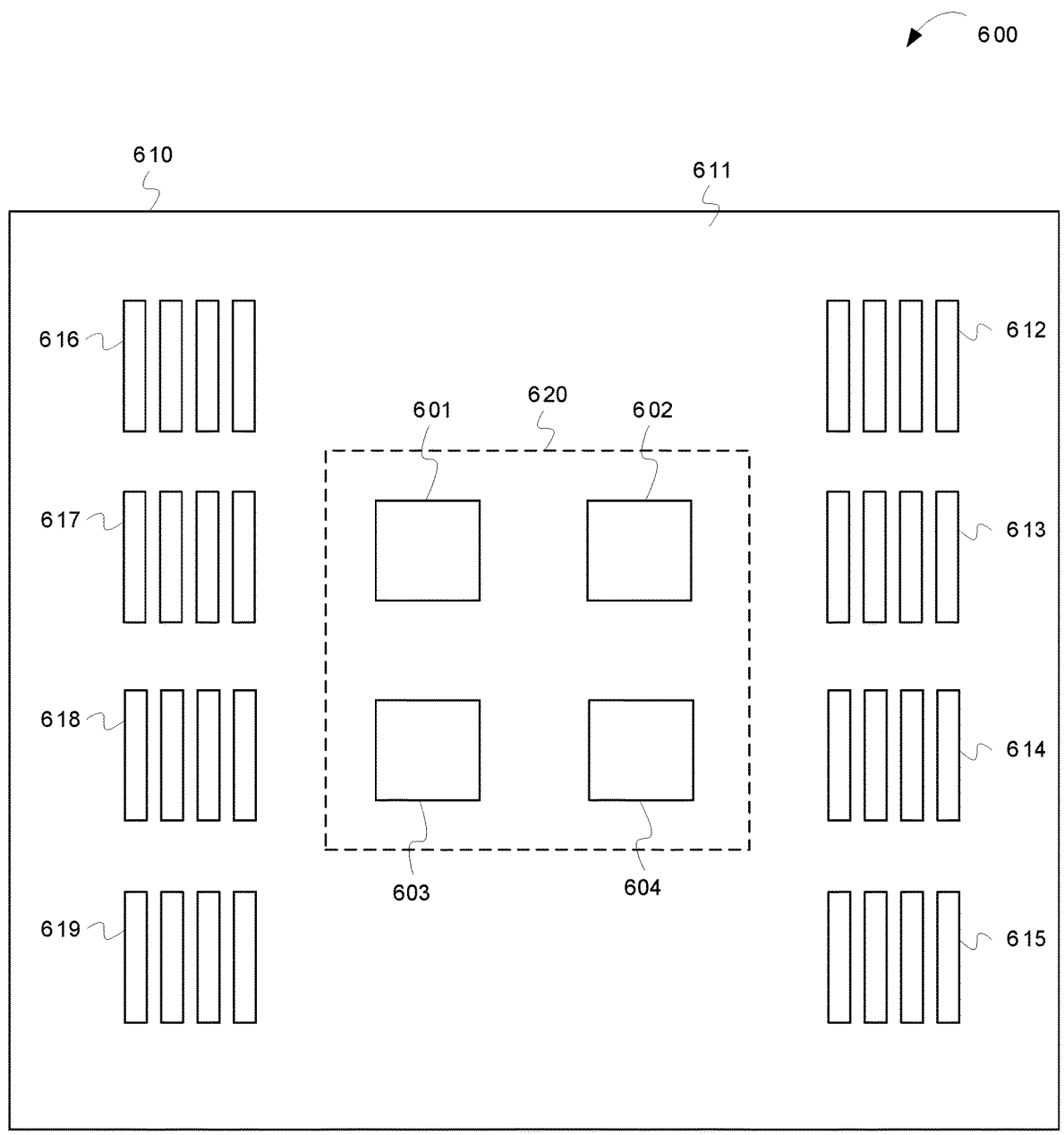
FIG. 6 is an example conceptual diagram of a PCBA 600 according to some embodiments.

FIG. 6 is an example conceptual diagram of a PCBA 600 according to some embodiments. In FIG. 6, the PCBA 600 includes a first PCB 610 affixed to a second PCB 620. The second PCB 620 is smaller than the first PCB 610 as similarly described above. Example electronic components (e.g., SCMs 601, 602, 603, and 604 and memory module 612, 613, 614, 615, 616, 617, 618, and 619) are attached to the first PCB 610. The second PCB 620 is shown as a dashed line to represent that the second PCB 620 is opposite to a surface 611 of the first PCB 610. The SCMs 601, 602, 603 and 604 are arranged in a matrix form. The matrix form is a different configuration from an inline form demonstrated by the arrangement of the SCMs 101, 102, and 103 in FIGS. 1A, 1B, 3 and 4. In FIG. 6, the second PCB 610 has a shape that conforms to the arrangement of the SCMs 601, 602, 603 and 604.

Figure 7:
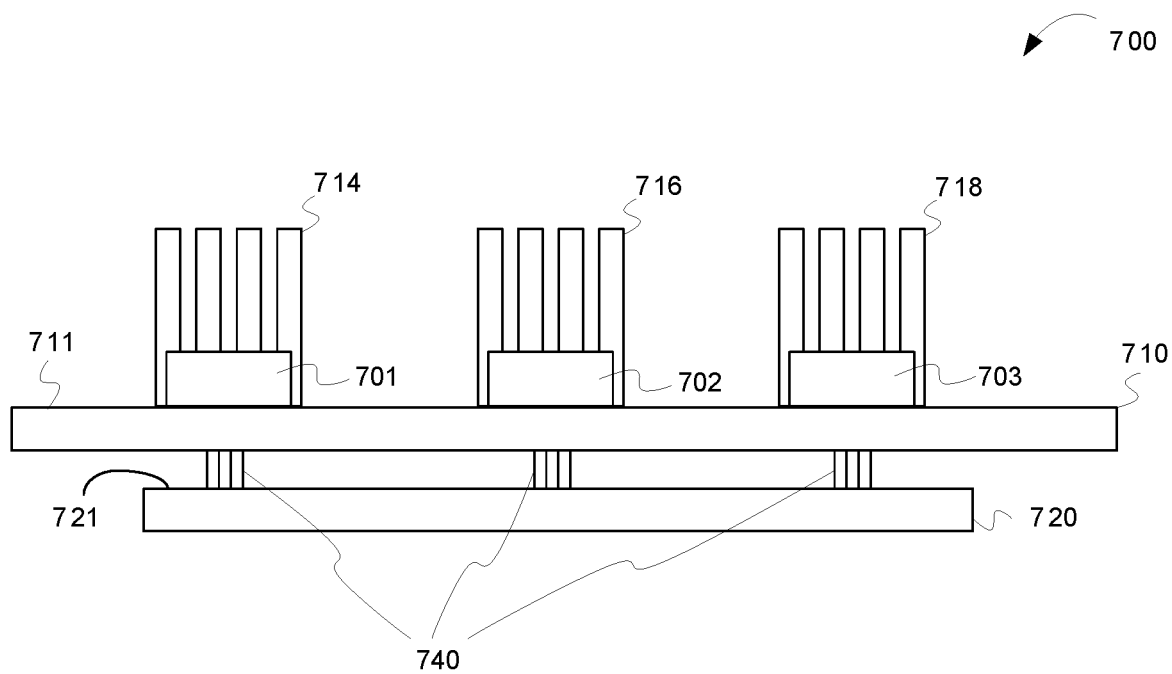
FIG. 7 is an example conceptual diagram of a PCBA 700 according to some embodiments.

FIG. 7 is an example conceptual diagram of a PCBA 700 according to some embodiments. The PCBA 700 includes many similar elements as the PCBA 100 in FIGS. 1A-1C. In FIGS. 1A-1C, however, the second PCB 120 is connected directly to the underside surface of the first PCB 120, such as by a lamination process, so that there is no space between the first PCB 110 and the second PCB 120. In FIG. 7, however, a first PCB 710 is connected to a second PCB 720 via land grid array (LGA) connectors 740. A first surface 711 of the first PCB 710 can include attached electronic components, such as SCMs 701, 702, and 703 and memory modules 714, 716, and 718. A second surface 721 of the second PCB 720 can include wiring that extends from the LGA connectors across the second PCB 720 to interconnect the LGA connectors 740. The PCBA 700 includes vias that extend through a thickness of the first PCB 710 to connect a portion of the leads from the SCMs 701, 702, and 703 to pins on the LGA connectors 740. In some embodiments, the PCBA 700 can further include vias that extend through some or all of the thickness of the second PCB 720.

Figure 8:
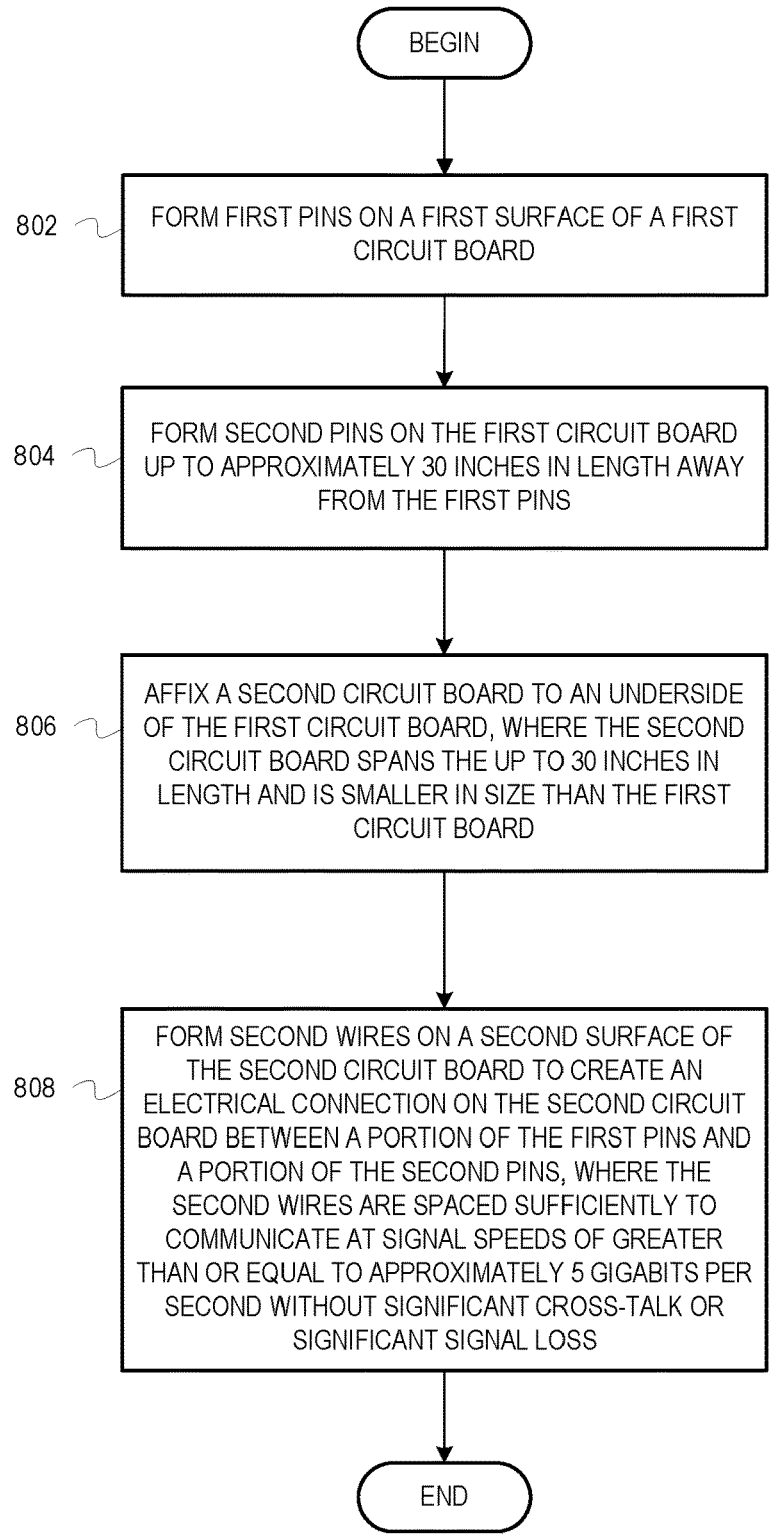
FIG. 8 is a flowchart depicting example operations for forming a PCB structure according to some embodiments.

FIG. 8 is a flowchart depicting example operations for forming a PCB structure according to some embodiments. For exemplary purposes, operations associated with the blocks in FIG. 8 will be described as being performed by a PCB fabrication system ("system"), which may, for example, include any or all of the elements described in FIGS. 1A-1C, 2, 3, 4, 5, 6, 7, and 9. FIG. 8 illustrates a flow that the system can perform.

Referring to FIG. 8, the system forms first pins on a first surface of a first circuit board (802). The first pins are configured to connect to leads of a first electronic component.

Further, the system forms second pins on the first circuit board (804). The second pins are configured to connect to leads of a second electronic component. The second pins are, in some embodiments up to approximately 30 inches in length away from the first pins.

Further, the system affixes a second circuit board to an underside of the first circuit board where the second circuit board spans the up to approximately 30 inches in length and is smaller in size than the first circuit board (806). The first circuit board includes a first surface configured with first wires. The second circuit board includes a second surface configured for forming circuitry. For example, the second circuit board can be coated with a metallic material (e.g., copper) from which copper-wire circuitry can be formed. The second surface of the second circuit board can be limited in size (e.g., length, width, etc.) to be approximately a size (e.g., length, width, etc.) of an area on the first surface that includes the first electronic component and the second electronic component. For instance, a length of the second circuit board can be approximately the size of a distance between the first electronic component and the second electronic component if the first electronic component and the second electronic component are the furthest units in a group of electronic units that need to be connected, and communicate at high speeds, via second wires formed on the second circuit board. The distance between the first electronic component and the second electronic component can be beyond conventional distances (e.g., beyond the 2-3 inches between electronic components of some conventional type configurations). For example, as stated above, the distance between the first electronic component and the second electronic component can be as far apart, in some embodiments, as approximately 30 inches. In some embodiments, the first circuit board includes a third surface opposite and perpendicular to the first surface, and the second circuit board includes a fourth surface opposite and perpendicular to the second surface. The system can laminate the third surface of the first circuit board to the fourth surface of the second circuit board.

Further, the system forms second wires on a second surface of the second circuit board to create an electrical connection on the second circuit board between a portion of the first pins and a portion of the second pins, where the second wires are spaced sufficiently to communicate at signal speeds of greater than or equal to approximately 5 Gbps without significant cross-talk or significant signal loss (808). In some embodiments, the system can form the second wires to have wire widths sufficient to limit signal attenuation to less than or equal to 12 decibels over the up to approximately 30 inches in distance between the first electronic component and the second electronic component for signal communications greater than or equal to the approximately 5 Gbps. Further, the system can space the second wires on a layer of the second circuit board to have a signal-to-cross-talk ratio of greater than 17 decibels for signal communications greater than or equal to the approximately 5 Gbps.

In some embodiments, the system can form first vias configured to connect the portion of the first pins to third pins on the second surface of the second circuit board. The system can further form second vias configured to connect the portion of the second pins to fourth pins also on the second surface of the second circuit board. In some embodiments, the first vias and second vias can extend, at least, through a thickness of the first circuit board. In some embodiments, the first vias and second vias can also extend through a thickness of the second circuit board. The system can further connect the third pins to the fourth pins via the second wires. In some embodiments, the system can attach the first wires to create an electrical connection between a second portion of the first pins and a second portion of the second pins via the first surface of the first circuit board. The second portion of the first pins and the second portion of the second pins can be exclusive of the first portion of the first pins and the second portion of the second pins. In other words, in some embodiments, the system connects some of the pins for the first and second electronic components on the first circuit board and some of the pins (e.g., different pins) for the first and second electronic components on the second circuit board.

Figure 9:
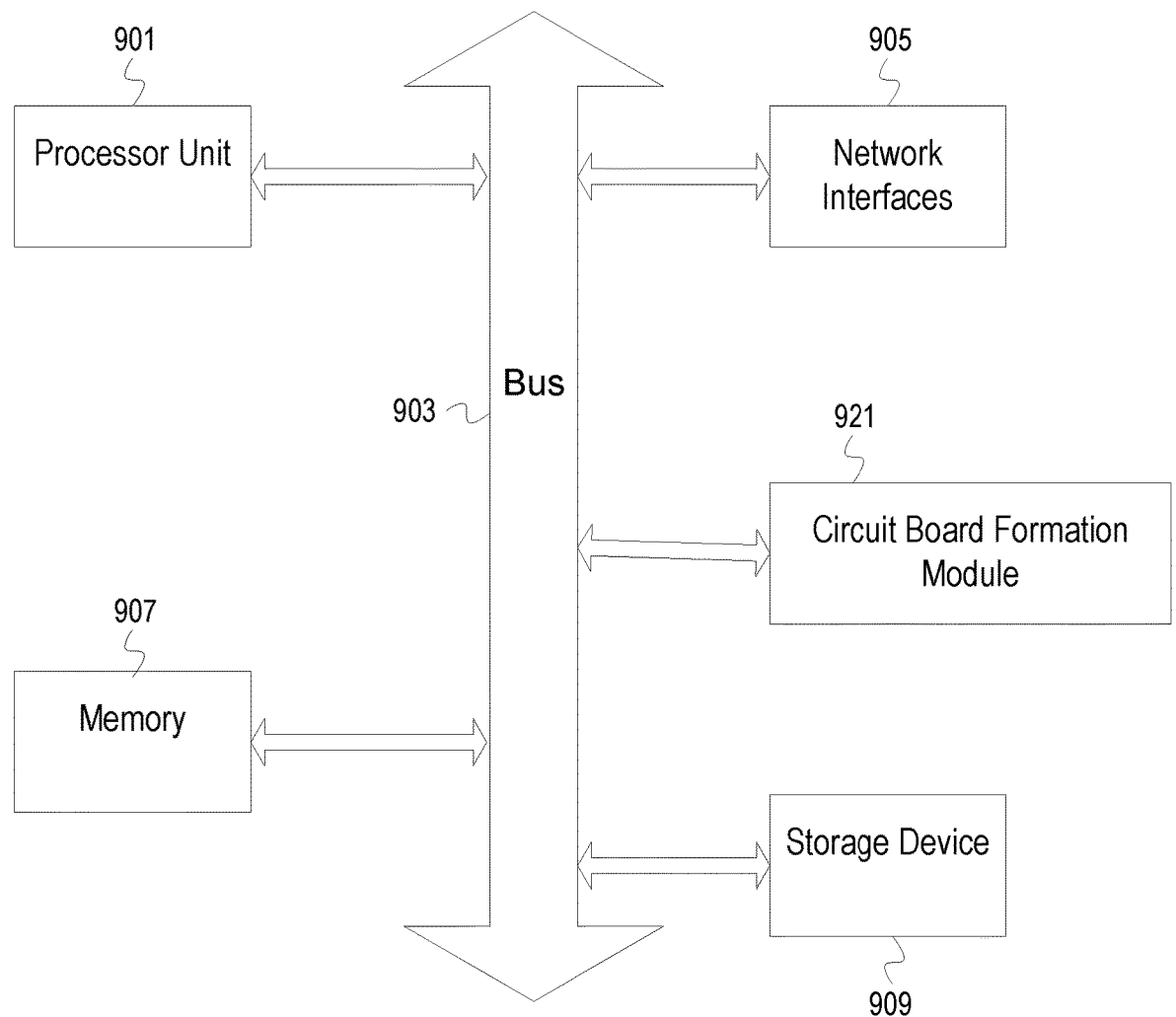
FIG. 9 depicts an example computer system 900.

FIG. 9 depicts an example computer system 900. The computer system 900 includes a processor unit 901 (possibly including multiple processors, multiple cores, multiple nodes, and/or implementing multi-threading, etc.). The computer system 900 includes memory 907. The memory 907 may be system memory (e.g., one or more of cache, SRAM, DRAM, zero capacitor RAM, Twin Transistor RAM, eDRAM, EDO RAM, DDR RAM, EEPROM, NRAM, RRAM, SONOS, PRAM, etc.) or any one or more of the above already described possible realizations of machine-readable or computer readable media. The computer system 900 also includes a bus 903 (e.g., PCI bus, ISA, PCI-Express bus, HyperTransport® bus, InfiniBand® bus, NuBus bus, etc.), a network interface 905 (e.g., an ATM interface, an Ethernet interface, a Frame Relay interface, SONET interface, wireless interface, etc.), and a storage device(s) 909 (e.g., optical storage, magnetic storage, etc.). The computer system 900 also includes circuit board formation module 921. The circuit board formation module 921 can control formation (e.g., design, simulation, test, layout, manufacture, etc.) of circuit boards on which integrated circuit chips may be connected according to some embodiments. The circuit board design controller 921 can include individual components or parts that manage different aspects or parts of the circuit board formation Any one of these functionalities may be partially (or entirely) implemented in hardware and/or on the processing unit 901. For example, the functionality may be implemented with an application specific integrated circuit, in logic implemented in the processing unit 901, in a co-processor on a peripheral device or card, etc. Further, realizations may include fewer or additional components not illustrated in FIG. 9 (e.g., video cards, audio cards, additional network interfaces, peripheral devices, etc.). The processor unit 901, the storage device(s) 909, and the network interface 905 are coupled to the bus 903. Although illustrated as being coupled to the bus 903, the memory 907 may be coupled to the processor unit 901.

The computer system described above and the method described in the flow above may be used in a design, simulation, test, layout, and manufacture of circuit boards on which integrated circuit chips may be connected according to some embodiments. The method may include includes processes, machines and/or mechanisms for processing design structures or devices to generate logically or otherwise functionally equivalent representations of structures and/or devices described above and shown in FIGS. 1A-1C, 2, 3, 4, 5, 6 and 7. The design structures processed and/or generated may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in a circuit board design process, such as designing, manufacturing, or simulating a circuit board, a circuit board component, a circuit board device, or circuit board system. For example, machines may include machines and/or equipment for generating masks, computers or equipment for simulating design structures, any apparatus used in the manufacturing or test process, or any machines for programming functionally equivalent representations of the design structures into any medium (e.g. a machine for programming a programmable gate array). Design structures may include an input design structure and/or a logical simulation design structure. Design structures may also or alternatively comprise data and/or program instructions that when processed generate a functional representation of the physical structure of a circuit board, a portion of a circuit board, and/or hardware devices on the circuit board. Whether representing functional and/or structural design features, a design structure may be generated using electronic computer-aided design (ECAD) such as implemented by a core developer/designer. When encoded on a machine-readable data transmission, gate array, or storage medium, a design structure may be accessed and processed by one or more hardware and/or software modules within a design process to simulate or otherwise functionally represent a printed circuit board assembly, an electronic component on a printed circuit board, a circuit formed on or associated with the circuit board, electronic or logic modules, apparatus, device, or system such as those shown above. As such, a design structure may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

A design process can employ and incorporate hardware and/or software modules for synthesizing, translating, or otherwise processing a design/simulation functional equivalent of the components, circuits, devices, or structures shown above to generate a file which may contain design structures. The file may comprise, for example, compiled or otherwise processed data structures representing a list of wires, discrete components, models, etc. that describe the connections to other elements and circuits in a circuit board design. The file may be synthesized using an iterative process in which the file is resynthesized one or more times depending on design specifications and parameters for the device. As with other design structure types described herein, the file may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

A design process may include hardware and software modules for processing a variety of input data structure types. Such data structure types may reside, for example, within library elements and include a set of commonly used elements, circuits, and devices, including models, layouts, and symbolic representations, for a given manufacturing technology. The data structure types may further include design specifications, characterization data, verification data, design rules, and test data files which may include input test patterns, output test results, and other testing information. A design process may further include, for example, standard mechanical design processes such as stress analysis, thermal analysis, mechanical event simulation, process simulation for operations such as casting, molding, etc. One of ordinary skill in the art of mechanical design can appreciate the extent of possible mechanical design tools and applications used in a design process without deviating from the scope and spirit of the embodiments of the inventive subject matter described. A design process may also include modules for performing standard design processes such as timing analysis, verification, design rule checking, place and route operations, etc.

A design process may employ and incorporate logic and physical design tools such as HDL compilers and simulation model build tools to process a design structure together with some or all of the depicted supporting data structures along with any additional mechanical design or data (if applicable), to generate additional design structures that reside on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). The additional design structures can comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1A-1C, 2, 3, 4, 5, 6, and 7. In one embodiment, a design structure may comprise a compiled, executable HDL simulation model that functionally simulates the devices shown above.

A design structure may also employ a data format used for the exchange of layout data of circuit boards and/or symbolic data format. A design structure may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in figures above. A design structure may be transferred amongst different entities involved in designing and/or manufacturing.

As will be appreciated by one skilled in the art, aspects of the present inventive subject matter may be embodied as a system, method or computer program product. Accordingly, aspects of the present inventive subject matter may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present inventive subject matter may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present inventive subject matter may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present inventive subject matter are described with reference to flowchart illustrations and/or block diagrams of methods, apparatus (systems) and computer program products according to embodiments of the inventive subject matter. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

While the embodiments are described with reference to various implementations and exploitations, it will be understood that these embodiments are illustrative and that the scope of the inventive subject matter is not limited to them. In general, techniques for forming circuit boards and circuit board assemblies as described herein may be implemented with facilities consistent with any hardware system or hardware systems. Many variations, modifications, additions, and improvements are possible.

Plural instances may be provided for components, operations, or structures described herein as a single instance. Finally, boundaries between various components, operations, and data stores are somewhat arbitrary, and particular operations are illustrated in the context of specific illustrative configurations. Other allocations of functionality are envisioned and may fall within the scope of the inventive subject matter. In general, structures and functionality presented as separate components in the exemplary configurations may be implemented as a combined structure or component. Similarly, structures and functionality presented as a single component may be implemented as separate components. These and other variations, modifications, additions, and improvements may fall within the scope of the inventive subject matter.

What is claimed is:

1. A method comprising:
   forming a first circuit board that includes a first electronic component and an additional electronic component, said first electronic component including a plurality of leads, said first circuit board including first wires that connect to a first portion of the plurality of leads, said first circuit board further including a plurality of electrical connectors extending through a thickness of the first circuit board; and
   affixing a second circuit board to the first circuit board, said second circuit board including second wires, said second circuit board being smaller in size than the first circuit board; wherein the plurality of electrical connectors connect a second portion of the plurality of leads to the second wires, wherein the second circuit board is limited in size to approximately a distance between the first electronic component and the additional electronic component, wherein the distance between the electronic component and the additional electronic component is between approximately 5 inches to approximately 30 inches, and wherein the second wires include a spatial configuration on the second circuit board that has a signal-to-cross talk ratio of greater than 17 decibels for signal communications at greater than or equal to approximately 5 Gigabits per second for single ended signaling.

2. The method of claim 1, wherein the second wires have wire widths sufficient to limit signal attenuation on the second wires to less than or equal to 12 decibels over the distance for said signal communications at greater than or equal to approximately 5 Gigabits per second for single ended signaling.

3. The method of claim 1, wherein said additional electronic component includes an additional plurality of leads, said first wires connecting to a first portion of the additional plurality of leads, and said second wires further configured to connect a second portion of the additional plurality of leads via an additional plurality of electrical connectors that extend through the thickness of the first circuit board.

4. The method of claim 1, wherein the first circuit board is laminated to the second circuit board.

5. The method of claim 1, wherein the plurality of electrical connectors include one or more vias that connect to land grid array connectors.

6. The method of claim 1, wherein the second circuit board includes connections between only high speed electronic components, and wherein the size of the second circuit board is configured for widths and spacing of the second wires to have less signal loss and lower signal-to-crosstalk values than the first wires on the first circuit board.

7. The method of claim 1, wherein the plurality of electrical connectors extend from the second portion of the plurality of leads through holes in a board material of the first circuit board to the second wires.

8. The method of claim 7, wherein the holes extend from a first surface of the first circuit board in which the first wires are situated, through the board material, and out of a second surface of the first circuit board, wherein the thickness of the first circuit board is a distance from the first surface to the second surface, and wherein the holes are oriented perpendicular to both the first surface and the second surface.

9. The method of claim 1, wherein a size of the second circuit board is approximately equivalent to a combination of a first area of a surface that encompasses the first electronic component plus a second area of the second printed circuit board on which the second set of wires are formed.

10. The method of claim 1, wherein the second circuit board has a one-to-one ratio of signal to reference pins.

* * * * *